United States Patent
Chan et al.

[19]

[11] Patent Number: 6,167,321
[45] Date of Patent: Dec. 26, 2000

[54] INTERFACE MODULE WITH PROTECTION CIRCUIT AND METHOD OF PROTECTING AN INTERFACE

[75] Inventors: Ting-Li Chan, Laguna Niguel; Thinh D. Tran, Aliso Viejo, both of Calif.

[73] Assignee: QLogic Corporation, Aliso Viejo, Calif.

[21] Appl. No.: 09/104,731

[22] Filed: Jun. 25, 1998

[51] Int. Cl.[7] .................................................... G06F 13/00
[52] U.S. Cl. ............................... 700/100; 700/110; 700/8; 700/62; 307/296.1; 327/143; 361/91; 361/93; 361/119
[58] Field of Search .................................... 710/100, 110, 710/8, 62; 361/93, 119, 91, 42, 57, 58, 59, 62, 63, 54, 55; 327/143; 359/172, 176; 307/296.1

[56] References Cited

U.S. PATENT DOCUMENTS

| | | | |
|---|---|---|---|
| 4,574,355 | 3/1986 | Beatty et al. | 364/492 |
| 5,341,034 | 8/1994 | Matthews . | |
| 5,349,644 | 9/1994 | Massey et al. | 395/200 |
| 5,365,546 | 11/1994 | Koenck et al. | 375/9 |
| 5,537,360 | 7/1996 | Jones et al. | 365/226 |
| 5,537,626 | 7/1996 | Kraslavsky et al. | 710/8 |
| 5,566,339 | 10/1996 | Perholtz et al. | 713/340 |
| 5,617,236 | 4/1997 | Wang et al. | 359/172 |
| 5,627,716 | 5/1997 | Lagree et al. | 361/93 |
| 5,903,426 | 5/1999 | Ehling | 361/119 |
| 5,948,085 | 9/1999 | Blatter | 710/100 |

FOREIGN PATENT DOCUMENTS 0 621 692  10/1994  European Pat. Off. .

OTHER PUBLICATIONS

International Search Report for counterpart foreign application.

"Information Technology—SCSI Parallel Interconnect 2 (SPI-2)" (REV 08); May 28, 1996; pp. 2–50.

*Primary Examiner*—Ayaz R. Sheikh
*Assistant Examiner*—Frantz B. Jean
*Attorney, Agent, or Firm*—Knobbe, Martens, Olson & Bear, LLP

[57] ABSTRACT

An interface module for a communications system includes a processing device and a peripheral device which are interconnected through a communications bus. The interface module includes a transceiver interface and a protection circuit. The protection circuit is positioned between the transceiver interface and a port configured to receive a signal from a terminal of the communications bus. The protection circuit is further configured to automatically provide a protection voltage to the transceiver interface if a power supply for the transceiver interface is inactive. The protection voltage is derived from the signal received at the terminal.

14 Claims, 8 Drawing Sheets

INTERFACE MODULE WITH PROTECTION CIRCUIT AND METHOD OF PROTECTING AN INTERFACE

BACKGROUND OF THE INVENTION

1. Field of the Invention

The present invention relates to a communications system wherein system components communicate via a communications bus. More particularly, the invention relates to interface modules for such system components and to a method of protecting such interfaces.

2. Description of the Related Art

An exemplary communications system comprises a computer and one or more peripheral devices. The peripheral devices can include, for example, external disk drives, printers or data communications devices. The computer and the peripheral devices communicate via a communications bus which is, for example, a bus in accordance with a Small Computer System Interface (SCSI) specification. The SCSI specification defines a bus that comprises 54 lines and supports bidirectional data transmission in two electrical specifications, single-ended and low-voltage differential. Further details of the SCSI bus are described in a book entitled "SCSI Understanding the Small Computer System Interface," PTR Prentice Hall, Englewood Cliffs, N.J. 07632, ISBN 0-13-796855-8.

The computer and the peripheral devices comprise interface modules which, inter alia, organize communications between the computer and the peripheral devices in accordance with a defined communications protocol.

Internally, the interface modules comprise integrated circuits which are, for example, made with a semiconductor process technology using a line width of 0.45 microns or below. These circuits are intended to be in communication with a 3-volts bus. Manufacturers of integrated circuits desire to add more integrated circuits into one chip to reduce the complexity of printed circuit boards. To control the power dissipation problem caused by densely packed circuits, the manufacturers try at the same time to reduce the power supply voltage necessary to operate the integrated circuits, for example, to about 3.3 volts and below. This requires a reduction of the threshold voltages of the field effect transistors used in such integrated circuits. By reducing the thickness of the gate oxide from about 120 angstrom (Å) to about 70 Å, the gate oxide breakdown voltage of a transistors has to be reduced from about 6–7 volts to about 4.5 volts.

The reduced gate oxide breakdown voltage poses a potential risk for an integrated circuit included in an inactive device when this inactive device is connected to an active system ("hot plugging"). Under such a condition, a voltage applied to transistors of the integrated circuit may exceed the breakdown voltage and destroy an integrated circuit.

SUMMARY OF THE INVENTION

There is therefore a need to protect the integrated circuits comprised in the components of a communications system.

One aspect of the present invention is an interface module for a communications system. The system comprises a processing device and a peripheral device which are interconnected through a communications bus. The interface module comprises a transceiver interface and a protection circuit. The protection circuit is substantially positioned between the transceiver interface and a port configured to receive a signal from a terminal of the communications bus. Further, the protection circuit is configured to automatically provide a protection voltage to the transceiver interface if a power supply for the transceiver interface is inactive. The protection voltage is derived from the signal received at the terminal.

Another aspect of the present invention is a communications system comprising a processing device and a peripheral device which are interconnected through a communications bus. Both the processing device and the peripheral device comprise an interface module that comprises a transceiver interface and a protection circuit.

A further aspect of the present invention is a method of protecting a transceiver interface associated with a communications bus to which a processing device and a peripheral device are connected, each one of said devices comprising a transceiver interface. The method comprises positioning a protection circuit between said bus and said transceiver interface, said protection circuit having a first input for a supply voltage, a second input connected to said bus and an output connected to the transceiver interface. The method further comprises generating within said protection circuit a control signal if said supply voltage is deactivated, using said control signal to connect said second input to said output in order to derive a protection voltage from a signal received from said bus, and feeding said protection voltage to the transceiver interface via said output.

An additional aspect of the present invention is an interface module for a communications system comprising a processing device and a peripheral device which are interconnected through a communications bus having a plurality of data lines. The interface module comprises a transceiver interface and a means for deriving a protection voltage from a signal received from said bus. The means for deriving a protection voltage are substantially positioned between said transceiver interface and a port configured to receive said signal, and are configured to automatically provide said protection voltage to the transceiver interface if a power supply for the transceiver interface is inactive.

BRIEF DESCRIPTION OF THE DRAWINGS

The foregoing features and other features of the present invention will now be described with reference to the drawings of a preferred embodiment of an interface module. In the drawings, the same components have same the reference numerals. The illustrated embodiment is intended to illustrate, but not to limit the invention. The drawings include the following figures.

DETAILED DESCRIPTION OF THE PREFERRED EMBODIMENT

Figure 1:
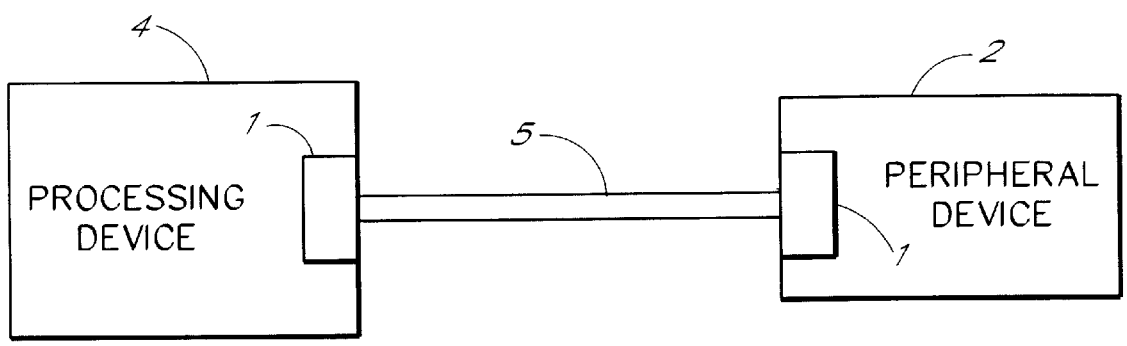
FIG. 1 shows a communications system comprising a processing device and a peripheral device interconnected through a communications bus.

FIG. 1 shows a simplified structure of a general communications system comprising a processing device 4 and a peripheral device 2 which are interconnected through a communications bus 5. The peripheral device 2 may be an external disk drive, a printer, a data communications device or any other device which can be connected to the processing device 4. Although not shown in the illustrated communications system, it is contemplated that one or more peripheral devices and one or more processing devices may be connected to the bus 5. The present invention is described with reference to a communications system comprising the processing device 4 which is in one embodiment a computer and a single peripheral device 2. The computer 4 and the peripheral device 2 communicate via the bus 5 which is, for example, a bus in accordance with a Small Computer System Interface (SCSI) specification. Those skilled in the art will appreciate that the bus 5 can be configured in accordance with other specifications for enabling communications between the system components 2, 4.

In the following description, the preferred embodiment of the invention is described with reference to a bus which is in accordance with the SCSI specification. The SCSI specification defines a bus that is made up of 54 lines and supports bidirectional data transmission in two electrical specifications, single-ended and low-voltage differential. The single-ended version uses a single line for each signal, referenced to a common ground. The differential version uses a pair of lines, sometimes referred to as "positive" and "negative", to differentiate actual signals from noise. In the differential version, each signal driver has two outputs and each signal receiver has two inputs.

The computer 4 and the peripheral device 2 comprise interface modules 1 which, inter alia, organize, monitor and control communications between the computer 4 and the peripheral device 2 in accordance with a communications protocol which encompasses timing, control, formatting and data representation of the data transmission. These interface modules 1 terminate the bus 5 within the computer 4 and the peripheral device 2.

Figure 2A:
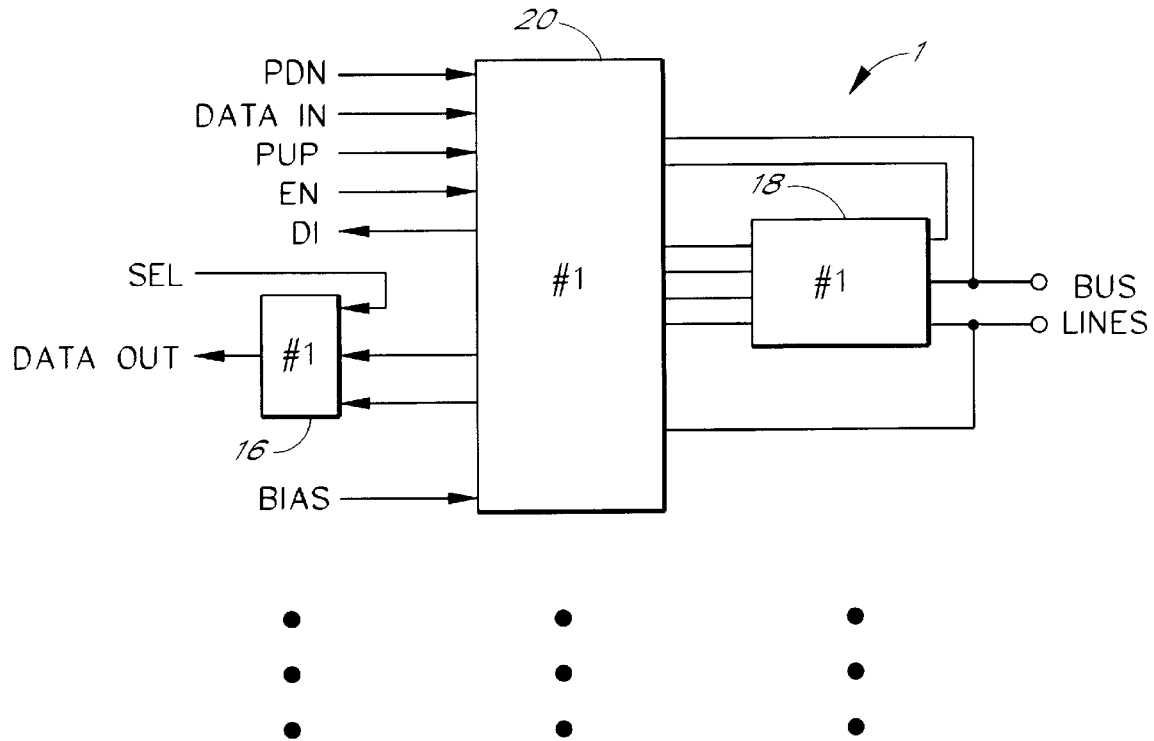
FIG. 2A shows a block diagram of an interface module in accordance with the invention.
Figure 2A:
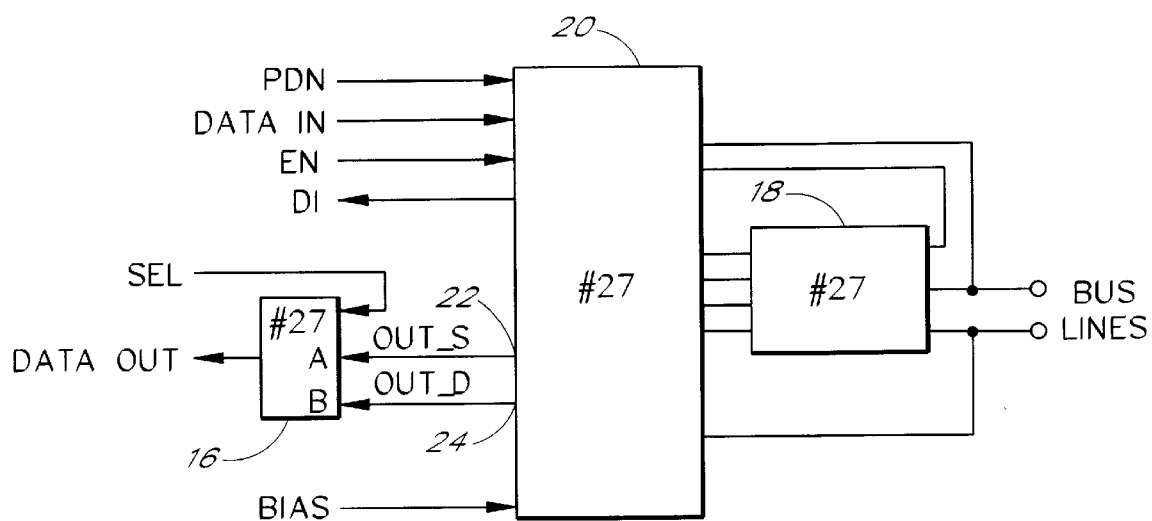

FIG. 2A shows a block diagram of a preferred embodiment of the interface module 1 included in the computer 4 and the peripheral device 2 shown in FIG. 1. The interface module 1 comprises 27 individual and identical sections, one section for each pair of lines of the bus 5. For ease of illustration, however, FIG. 2A shows only two sections, indicated as #1 and #27.

Each section comprises a transceiver interface 20 which operates bidirectionally. That is, the transceiver interface 20 receives data and control signals from the bus 5 and outputs the data and control signal for further processing within the computer 4 and the peripheral device 2, respectively. Further, the transceiver interface 20 receives internal data and control signals for transmission to the other system component over the bus 5.

Additionally, in the illustrated embodiment, each section comprises a multiplexer 16 and a protection circuit 18. The multiplexer 16 is interconnected between the transceiver interface 20 and internal processing circuits (not shown) of the computer 4 and the peripheral device 2, respectively. The protection circuit 18 is substantially interconnected between the transceiver interface 20 and the bus 5. The transceiver interface 20, however, has in the illustrated embodiment additional direct connections to the bus 5.

Referring to the section #27 in FIG. 2A, the transceiver interface 20 has two outputs 22, 24 which are connected to inputs A, B of the multiplexer 16, which further has an input for a control signal SEL. Depending on which input A, B is selected by the control signal SEL the multiplexer 16 outputs a signal DATA OUT which corresponds to a signal OUT_S received at the input A or a signal OUT_D received at the input B.

The transceiver interface 20 has several inputs which receive input signals PDN, PUP, DATA_IN, EN, BIAS, and an output for an output signal DI, as described below in greater detail in connection with FIG. 2B.

Figure 2B:
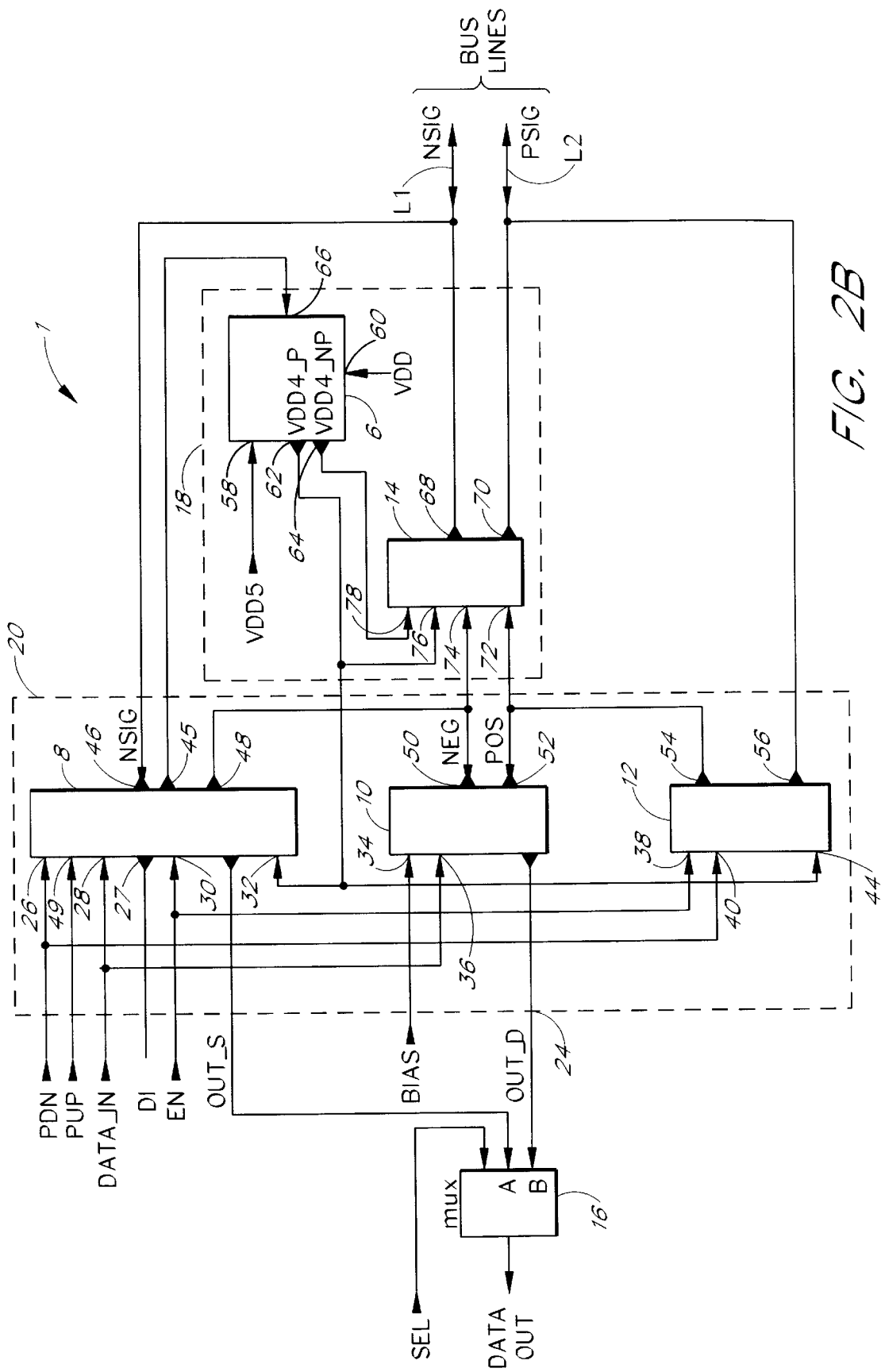
FIG. 2B shows a block diagram of a section of the interface module shown in FIG. 2A.

FIG. 2B shows a block diagram of a section of the interface module 1 shown in FIG. 2A. The transceiver interface 20 and the protection circuit 18 are illustrated with dashed lines to indicate correspondence with FIG. 2A. Those skilled in the art will appreciate that such a grouping is arbitrary and that another grouping or no grouping are possible.

The transceiver interface 20 preferably is a universal transceiver interface which allows operation in the single-ended mode and the low-voltage differential mode depending on the chosen mode. The transceiver interface 20 comprises three individual interfaces 8, 10, 12. The interfaces 8, 12 are activated in the single-ended mode only, whereby the interface 12, also referred to as ground driver, provides ground to the interface module 1 in the single-ended mode. In the universal transceiver interface 20, the interface 12 is not hard grounded and has an ON resistance of less than 20 ohms and shall remain on for the entire time the interface module 1 is powered and used in the single-ended mode.

The interface 10 is activated in the low-voltage differential mode only. That is, in the single-ended mode, the interface 10 is disabled. In the low-voltage differential mode, the interfaces 8, 12 are disabled. As a driver, the interface 10 generates a differential output voltage sufficient to achieve, for example, a minimum of +/−60 millivolts DC. Other characteristics that affect system performance include, for example, common-mode output voltage, maximum differential output voltage, output impedance, and output signal wave shape.

The section of the interface module 1 has two terminals L1, L2 which are connected to lines of the bus 5 shown in FIG. 1. Although not shown in FIG. 2B, it is contemplated that each interface 8, 10, 12 is connected to an internal power supply which may be the same as that used for the computer 4 and the peripheral device 2, respectively. Typically, the power supply provides a voltage of about 5 volts. Furthermore, by switching the power supply on and off, the interface module 1 can be activated (powered up) and deactivated (powered down). Deactivation of the interface module 1 can occur intentionally or unintentionally during, for example, power failure or other malfunction. In the deactivated state, no power supply voltage is applied to the interface module 1. However, as discussed below, certain portions of the interface module 1 receive power from the bus 5.

A control signal PDN (pull down) is input to an input 26 of the interface 8 and to an input 40 of the interface 12. A control signal PUP (pull up) is input to an input 49 of the interface 8. A data signal DATA_IN is input to an input 28 of the interface 8 and to an input 36 of the interface 10. An enable signal EN is input to an input 30 of the interface 8 and to an input 38 of the interface 12. A control signal BIAS is input to an input 34 of the interface 10. Further, the interfaces 8, 12 are interconnected via an input 32 of the interface 8 and an input 44 of the interface 12. The interface 8 outputs a signal DI at an output 27 and the signal OUT_S at its output 22. The interface 10 outputs the signal OUT_D at its output 24.

The interface 8 has an input/output port 46 connected to the terminal L1 for a signal NSIG, and an output 48 which is connected to an input/output port 50 of the interface 10. The input/output port 50 is dedicated to a signal NEG, and an input/output port 52 of the interface 10 is dedicated to a signal POS. This port 52 is connected to an output 54 of the interface 12. An input/output 56 of the interface 12 is connected to the terminal L2 (PSIG).

The protection circuit 18 comprises a selector module 6 and a switching module 14. The switching module 14 has two outputs 68, 70 connected to the terminals L1, L2, respectively. An input 72 of the switching module 14 is connected to the input/output port 52 (POS) of the interface 10, and a further input 74 of the switching module 14 is connected to the input/output port 50 (NEG) of the interface 10. An input 76 of the switching module 14 is connected to the inputs 32, 44 of the interfaces 8, 12, respectively, and to an output 62 (VDD4_P) of the selector module 6. A further output 64 (VDD4_NP) of the selector module 6 is connected to an input 78 of the switching module 14. An input 66 of the selector module 6 is connected to an output 45 of the interface 8. An input 58 of the selector module 6 is connected to a voltage supply, indicated as VDD5, and an input 60 is connected to a further voltage supply, indicated as VDD.

As shown in FIGS. 2A, 2B, the protection circuit 18 is interconnected substantially between the terminals L1, L2 of the bus 5 and the transceiver interface 20. Under normal operation conditions, the computer 4, the peripheral device 2 and their interface modules 1 are powered up and receive and transmit data and control signals. Transmission of a digital data signal over the bus occurs, for example, with levels of approximately +3 volts for a logic "1" and 0 volts for a logic "0" in the single-ended mode. Hereinafter, this single-ended mode is used to describe the exemplary operation of the interface module 1 and the protection circuit 18.

Under certain conditions, however, it can occur that either the computer 4 or the peripheral device 2 loses its internal power supply VDD5 and/or eventually loses VDD, intentionally or unintentionally. Although the device loses power, it continues to receive data from an active bus. Alternatively, a powered down peripheral device 2 is connected to an active bus ("hot plugging"). Under these circumstances, the protection circuit 18 of the powered down computer 4 or peripheral device 2 assures that a supply voltage is provided to the transceiver interface 20, even when the supply voltage of the computer 4 or the peripheral device 2 is shut off. The protection circuit 18 derives a voltage (approximately 3 volts if a logic "1") from the active bus to provide a "protection voltage" (VDD4_P in FIG. 3) to the interface module 1 in synchronism with the logic "1" of the signal on the bus 5. This protection voltage assures that a voltage is applied to the gates of internal field effect transistors having a bus voltage on their source or drain terminals. Thus, no transistor will have an excessive source-to-gate or drain-to-gate voltage on it. In addition, the transistors connected to the bus 5 block the bus voltage from any internal transistors that are not connected directly to the bus 5. Thus, no voltage in excess of, for example, 5 volts is applied to a field effect transistor having a floating gate. The voltage is always reduced to a value that is low enough to be of no risk for a field effect transistor having a reduced thickness of the gate oxide (about 70 angstrom).

Figure 3:
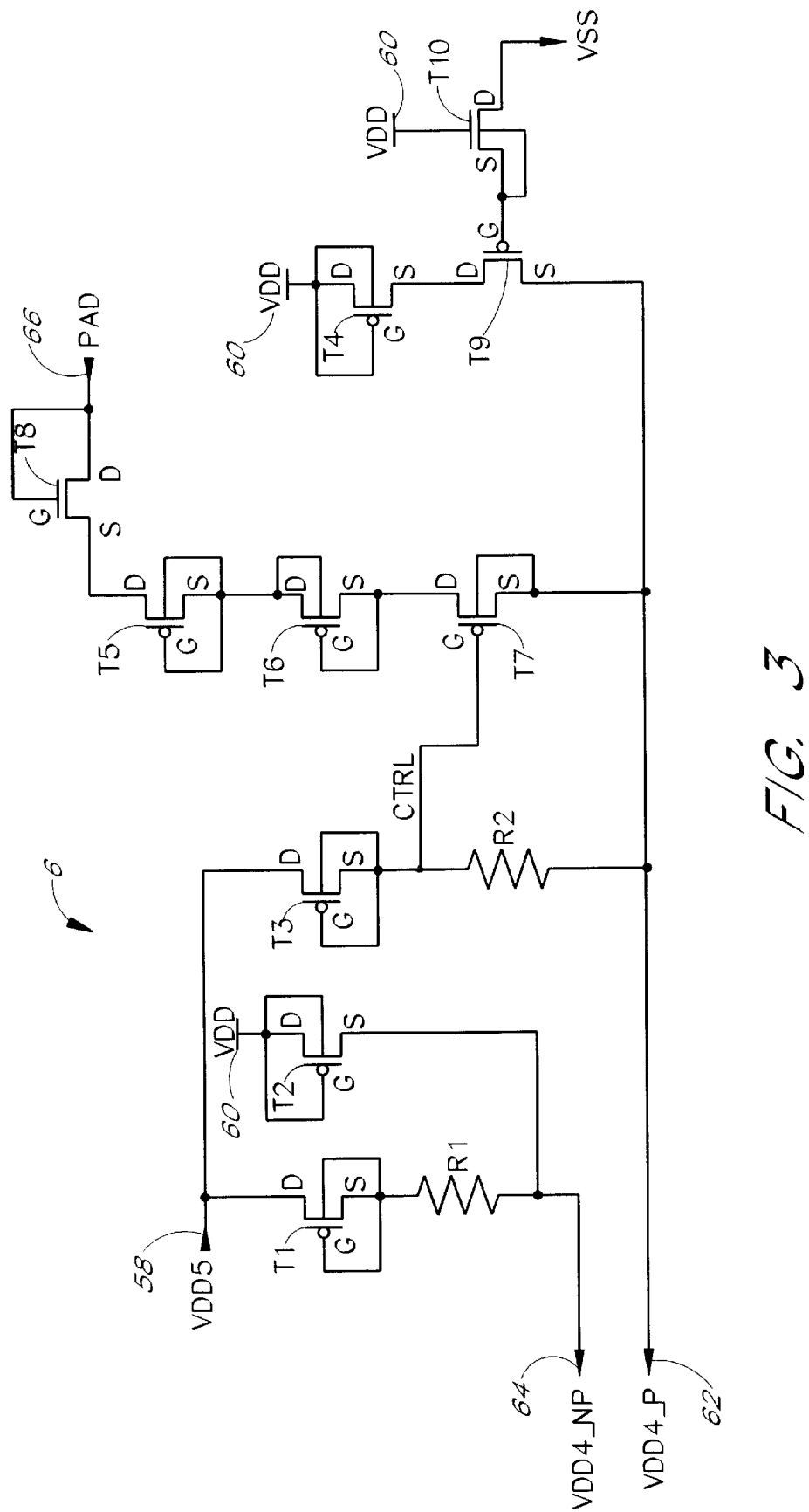
FIG. 3 shows an embodiment of a protection circuit included in the section of the interface module shown in FIG. 2B.

FIG. 3 shows details of a preferred embodiment of the selector module 6 included in the protection circuit 18 shown in FIG. 2B. As shown in FIG. 2B, the selector module 6 has the inputs and outputs 58–66. In FIG. 3, voltage signals are assigned to the inputs and outputs 58, 62, 64, 66. The input 66 receives a voltage PAD, the input 58 receives the voltage VDD5, the output 64 outputs the voltage VDD4_P ("protected with power down") and the output 62 outputs a voltage VDD4_NP ("non-protected with power down"). A voltage VDD is applied to ports 60.

The selector module 6 comprises several p-channel field effect transistors T1–T7, T9 and n-channel field effect transistors T8, T10. Each transistor T1–T10 has a gate G, a drain D and a source S. In the following description a field effect transistor is generally referred to as "FET". The FETs T1–T10 are implemented in CMOS technology on a substrate. A p-channel FET is active (conducting) when a low voltage, for example 0 volt (logic "0"), is applied to its gate ("active low"). An n-channel FET is active when a higher voltage, for example 5 volts (logic "1"), is applied to its gate ("active high"). The FETs T1–T7, T9 are each connected in a "floating well" structure which allow T1–T7, T9 to operate with different power voltages. The substrate (bulk) of the FETs T1–T7 is associated with the source S (T1, T3, T5 and T7) or the drain D (T2, T4, T6).

The input 58, referred to as VDD5 terminal, is connected to the drain D of the FET T1. The gate G, the substrate (bulk) and the source S of the FET T1 are connected to a first terminal of a resistor R1 having in one embodiment a resistance of about 4 kiloohms. A second terminal of the resistor R1 is connected to the output 64, referred to as VDD4_NP terminal, and to the source S of the FET T2. The gate G, the substrate (bulk) and the source S of the FET T2 are both connected to the VDD port 60 (+3 volts).

The VDD5 terminal 58 is further connected to the drain D of the FET T3. The gate G, the substrate (bulk) and the source S of the FET T3 are connected to a first terminal of a resistor R2 having in one embodiment a resistance of about 4 kiloohms. A second terminal of the resistor R2 is connected to the output 62, referred to as VDD4_P terminal. The VDD4_P terminal 62 is further connected to the source S of the FET T9 whose gate G is connected to the source S and the substrate (bulk) of the FET T10. The drain D of the FET T10 is connected to ground (VSS) and the gate is connected to the VDD port 60. The drain D of the FET T9 is connected to the source S of the FET T4. The drain D, the substrate (bulk) and the gate G are connected to the VDD port 60.

The input 66, referred to as PAD input, is connected to the drain D and the gate G of the FET T8 whose source S is connected to the drain D of the FET T5. The n-channel FET T8 is connected to serve as a protection diode to avoid a direct connection between the FET T5 and the PAD input 66. The gate G, the substrate (bulk) and the source S of the FET T5 are connected to the drain D and the substrate (bulk) of the FET T6 whose gate G and source S are connected to the drain D of the FET T7. The gate of the FET T7 is connected to the first terminal of the resistor R2 and to the gate G and the source S of the FET T3. A control signal CTRL is assigned to the interconnection between the gate G of the FET T7 and the source S of the FET T3. The substrate (bulk) and the source of the FET T7 are connected to the VDD4_P terminal 62 and to the source S of the FET T9.

Under normal conditions, i.e., when the computer and the peripheral device are powered up and a positive voltage VDD5 of about 5 volts is applied to the VDD5 terminal 58, and a positive voltage VDD of about 3 volts is applied to the VDD input 60, the FET T1 and the FET T3 are conducting ("active low") and the FETs T2, T4 are off to provide a high resistance connection, and a small current flows from the VDD5 terminal 58 to the VDD port 60. In each branch, the current causes a voltage across the FETs T2, T4, respectively. The voltage of about 3.3 volts (measured against ground) across the FET T2 caused by the current through the FET T1 is output at the VDD4_NP terminal 64, and the voltage of about 3.3 volts (measured against ground) caused by the current through the FET T3 is output at the VDD4_P terminal 62.

Under these normal conditions, the FET T10 is conducting ("active high") connecting the gate G of the FET T9 to ground (VSS). The "active low" FET T9 conducts and provides a low resistance connection between the source S of the FET T4 and the VDD4_P terminal 62. Moreover, only a leakage current flows through the FETs T5–T8 under these normal conditions since the control signal CTRL is "high" because of the voltage across the resistor R2.

However, when the voltage VDD5 is shut off or fails, no current flows from the VDD5 terminal 58 to the VDD port 60 and the control signal CTRL is "low", thus activating the FET T7. In this situation, if a positive voltage PAD, for example 3 volts, derived from an active bus signal is applied to the PAD input 66, a current flows from the PAD input 66 through the FETs T4–T8 to the VDD port 60, which is in one embodiment a voltage of about 3 volts. The current causes a voltage of about 1 volt across the FETs T4, T9 which is output at the VDD4_P terminal 62. This voltage corresponds to the protection voltage VDD4_P. Therefore, the VDD4_P terminal 62 outputs a voltage of about 3.3 volts under normal operation conditions and a voltage of about 1.35 volts during powered down or failure conditions if a PAD voltage is derived from the active bus.

Figure 4:
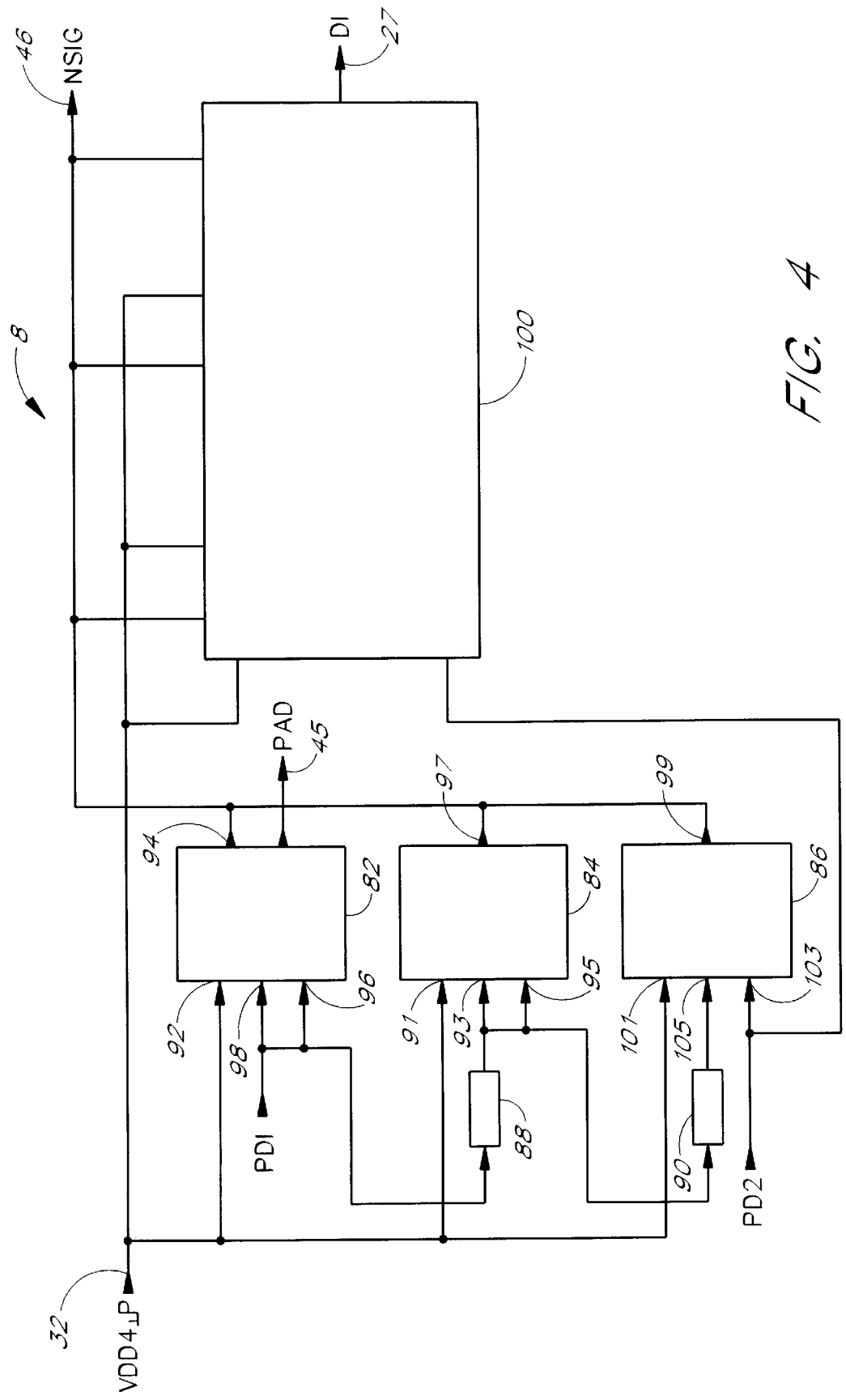
FIG. 4 shows an exemplary block diagram of an electronic circuit included in a transceiver interface of the interface module.
Figure 5:
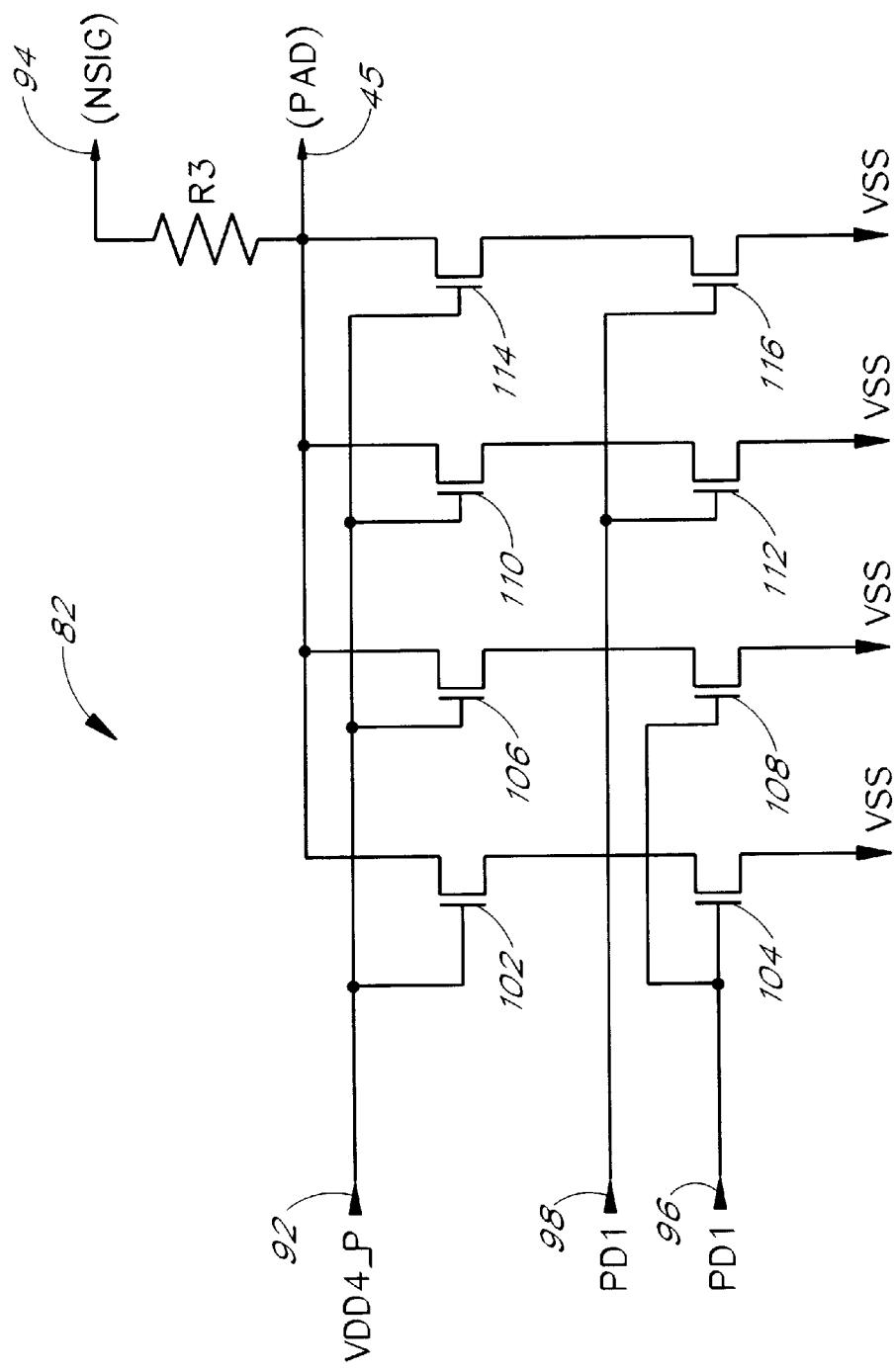
FIG. 5 shows a schematic of the electronic circuit shown in FIG. 4.

The above-described positive voltage PAD is, in a preferred embodiment of the interface module, output from the interface 8 (output 45) shown in FIG. 2B. A portion of the interface 8 which is associated with the output 45 is shown in FIG. 4. The illustrated portion of the interface 8 comprises various similar circuits 82, 84, 86, whereas the circuit 82 outputs the PAD voltage which is output at the output 45 of the interface 8. Details of the circuit 82 are shown in FIG. 5. A remaining portion of the circuit 82 is generally indicated as a block 100. An input 92 of the circuit 82 is connected to the VDD4_P input 32, and a port 94 is connected to the NSIG port 46. The circuit 82 has inputs 96, 98 for a control signal PD1.

The VDD4_P input 32 is further connected to an input 91 of the circuit 84 and to an input 101 of the circuit 86. The control signal PD1 is input to a delay module 88 whose output is connected to inputs 93, 95 of the circuit 84. A port 97 of the circuit 84 and a port 99 of the circuit 86 are also connected to the NSIG port 46. The output of the delay module 88 is further connected to an input of a delay module 90 whose output is connected to an input 105 of the circuit 86. An input 103 of the circuit 86 receives a further control signal PD2 which is also input to the circuitry 100. The circuit 100 is additionally connected to the VDD4_P input 32 and the NSIG port 46.

FIG. 5 shows details of the circuit 82 which, in the illustrated embodiment, comprises eight n-channel FETs 102–116. The FETs 102, 104 are connected in series between the output 45 (PAD) and ground (VSS). The gate of the FET 102 is connected to the VDD4_P input 92, and the gate of the FET 104 is connected to the PD1 input 96. The FETs 106 and 108, 110 and 112, and 114 and 116 are connected alike, whereas the gates of the FETs 112, 116 are connected to the PD1 input 98. A resistor R3 is connected between the output 45 (PAD) and the port 94 (NSIG). The resistor R3 has a value of about 2 ohms. Because of this low value, it is contemplated that the signal NSIG is directly input (via the PAD output 45) into the PAD input 66 of the selector module 6 shown in FIG. 2B.

With reference to FIGS. 4 and 5, the portion of the interface 8 serves to pull down the NSIG port 94 in a predetermined controlled manner when the control signal PDN in FIG. 2B indicates a pulled down power for the system. This controlled power pull down procedure prevents the NSIG port 94 from becoming grounded. The control signals PD1, PD2 are derived from the control signal PDN. When both the VDD4_P input 32 (92) and the control signal PD1 are high, the FETs 102–116 are conducting providing a low resistance connection between the PAD output 45 and ground, whereby the NSIG port 94 is connected to VSS (ground) via a low resistance connection.

The control signal PD1 is further input into the delay module 88 which delays the control signal PD1 for a certain time. Thus, the circuit 84 also connects the NSIG port 94 to VSS (ground) via a low resistance connection, however, later than the circuit 82. Similarly, the circuit 86 provides an additional (delayed) path from the NSIG port 94 to VSS. The NSIG port 94 is thereby step-by-step additionally connected to VSS via a low resistance connection.

Figure 6:
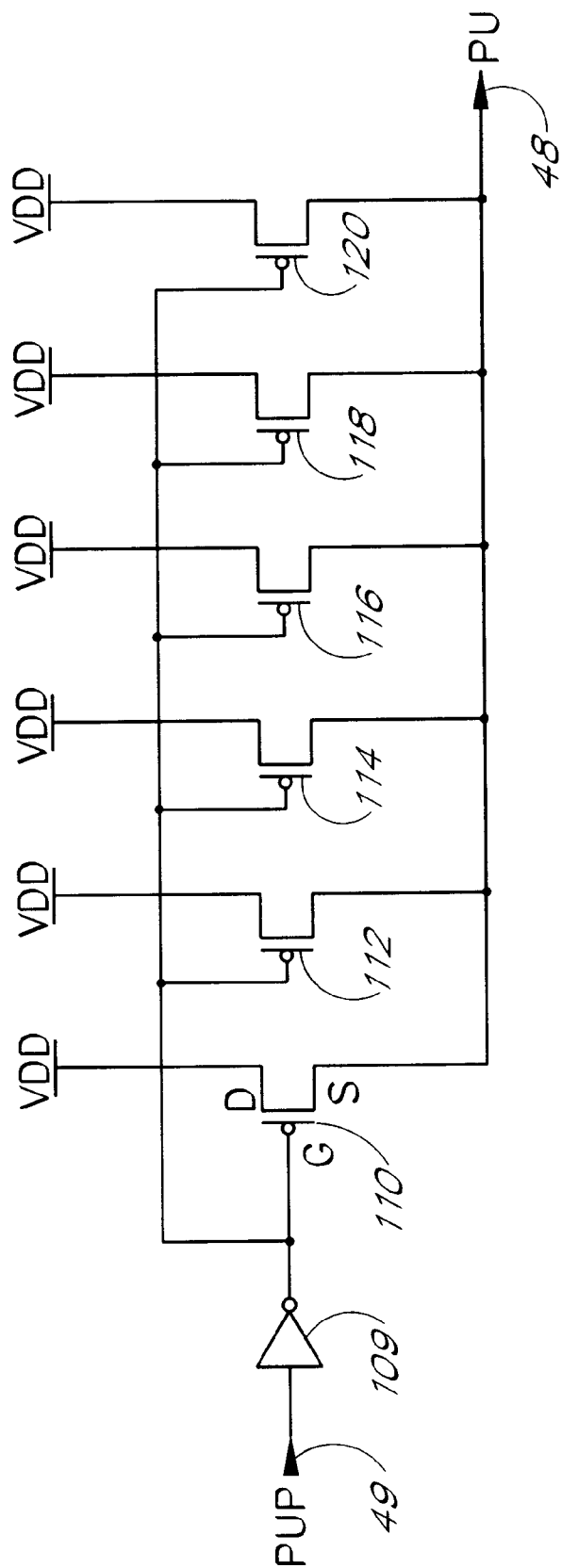
FIG. 6 shows a schematic of a pull-up circuit included in a transceiver module of the interface module.

FIG. 6 shows a pull-up circuit which is included in the interface 8. The pull-up circuit has the input 49 (FIG. 2B) for a control signal PUP and the output 48 (FIG. 2B) for a pull-up signal PU. The input 49 is connected to an inverter 109 which inverts the control signal PUP. For example, six p-channel FETs 110–120 are connected in parallel, with the gates connected to an output of the inverter 109, the sources S connected to the output 48 and the drains D connected to the VDD voltage. When the control signal PUP is high, the FETs 110–120 are turned on causing the pull-up signal PU to be pulled up to the voltage VDD. Because the output 48 is connected to the input/output port 50 of the interface 10 and to the input 74 of the switching module 14, these ports 50, 74 are pulled-up to high by the active signal PU.

Figure 7:
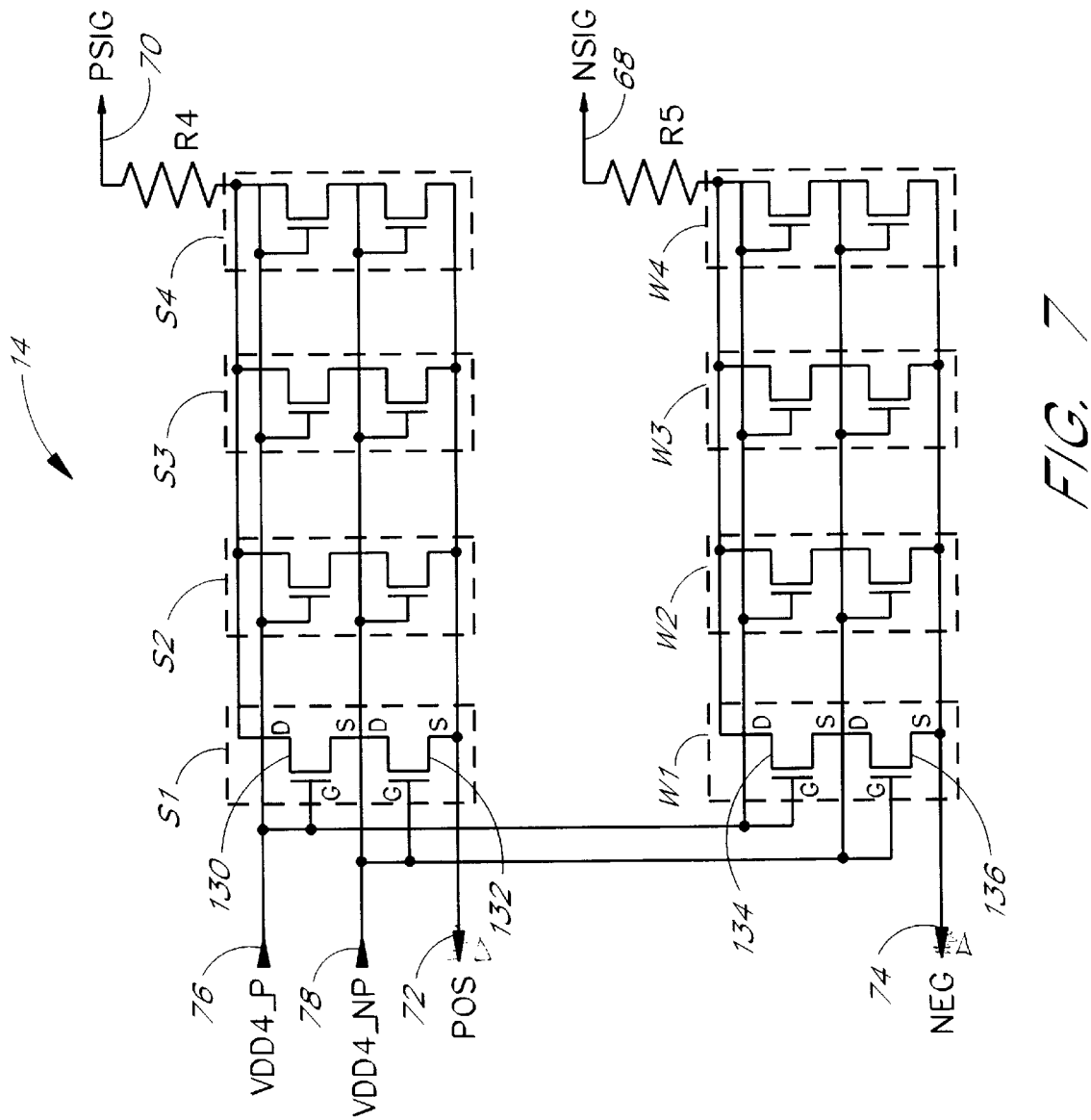
FIG. 7 shows an embodiment of a switching module included in the section of the interface module shown in FIG. 2B.

FIG. 7 shows a preferred embodiment of the switching module 14 shown in FIG. 2B. The illustrated switching module 14 has inputs and outputs 68–78 and comprises a plurality of individual and identical switches S1–S4, W1–W4. The switches S1–S4 are connected in parallel between the inputs 72 (POS), 76 (VDD4_P), 78 (VDD4_NP) and the output 70 (PSIG). The switches W1–W4 are connected in parallel between the inputs 74 (NEG), 76 (VDD4_P), 78 (VDD4_NP) and the output 68 (NSIG).

With reference to the switch S1, each switch S1–S4 comprises an active high n-channel FET 130, its gate G connected to the input 76, referred to as VDD4_P input, and its drain D connected to the output 70, referred to as PSIG output. Each switch S1–S4 further includes an active high n-channel FET 132, its gate G connected to the input 78, referred to as VDD4_NP input, its source S connected to the input 72, referred to as POS output, and its drain D connected to the source S of the FET 130. When the VDD4_P input 76 and the VDD4_NP input 78 are both "high", both FETs 130, 132 are conducting and current flows from the POS input 72 to the PSIG output 70 via a resistor R4.

As shown with reference to the switch W1, each switch W1–W4 comprises an active high n-channel FET 134, its gate G connected to the VDD4_P input 76 and its drain D connected to the output 68, referred to as NSIG output, via a resistor R5. Each switch W1–W4 further includes an active high n-channel FET 136, its gate G connected to the VDD4_NP input 78 and its source S connected to the input 74, referred to as NEG input. The source S of the FET 134 is connected to the drain D of the FET 136. When the VDD4_P input 76 and the VDD4_NP input 78 are both "high", both FETs 134, 136 are conducting and current flows from the NEG input 74 to the NSIG output 68. The switching module 14 disconnects the bus from the interface 10 as soon as the interface module is powered down.

In the single-ended mode, the interface 12 provides ground to the PSIG terminal L2 (FIG. 2B) and to the input/output port 52 of the interface 10 and to the POS input 72 of the switching module 14, i.e., the signal POS is pulled-down to low (ground). In case the interface module is powered down and the bus is active, the PSIG terminal L2 is low and the NSIG terminal L1 receives a signal from the bus. The protection circuit 18 uses this signal to derive the protection voltage which is applied to gates of field effect transistors included in the interfaces 8, 12.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. An interface module for a communications system comprising a processing device and a peripheral device which are interconnected through a communications bus having a plurality of data lines, said interface module comprising:
   a transceiver interface; and
   a protection circuit, said protection circuit substantially positioned between said transceiver interface and a port configured to receive a data signal from a terminal of said communications bus, and configured to automatically provide a protection voltage to the transceiver interface if a power supply for the transceiver interface is inactive, said protection voltage being derived from said data signal received at said terminal.

2. The interface module of claim 1, wherein the protection circuit comprises a selector module configured to connect to the power supply and to receive the data signal from the terminal, said selector module further configured to detect if the power supply is inactive and to output said protection voltage when said power supply is inactive.

3. The interface module of claim 2, wherein the protection circuit further comprises a switching module configured to connect to the selector module, the bus and the transceiver interface, said switching module comprising a first switch controlled by the protection voltage and a second switch associated with the power supply, and being configured to disconnect the transceiver interface from the bus when said power supply is inactive.

4. The interface module of claim 3, wherein the first switch comprises a first transistor and the second switch comprises a second transistor serially connected to the first transistor, said first transistor configured to receive the protection voltage at a first control terminal and to connect to the terminal of said bus, and said second transistor configured to receive the power supply at a second control terminal and to connect to the transceiver interface, said first transistor being activated by said protection voltage and said second transistor being deactivated if said power supply is inactive.

5. The interface module of claim 4, wherein the first and second transistors are field effect transistors.

6. The interface module of claim 2, wherein the selector module comprises:
   a first port configured to connect to the power supply;
   a second port for receiving the data signal from the bus;
   a first output for a first voltage; and
   a second output for a second voltage;
   wherein the first and second outputs each provide a voltage when the power supply is active, and wherein only the second output provides said protection voltage when the power supply is inactive.

7. The interface module of claim 6, wherein the selector module further comprises:
   a first branch associated with the first port and the first output, said first branch comprising a third switch;
   a second branch associated with the first port and the second output, said second branch comprising a fourth switch; and
   a third branch associated with the second port and the second output, said third branch comprising a fifth switch configured to receive a control signal from the second branch.

8. The interface module of claim 7, wherein the third switch comprises a third transistor, the fourth switch comprises a fourth transistor, and the fifth switch comprises a fifth transistor which is controlled by the control signal.

9. The interface module of claim 1, comprising a plurality of said transceiver interface and said protection circuit, each transceiver interface and each protection circuit being associated with one of said data lines.

10. A communications system comprising:
    a communications bus, said communications bus including a plurality of data lines and being configured to allow bidirectional signal transmission;
    a processing device, said processing device comprising a first interface module, said first interface module configured to connect the processing device to the communications bus; and
    a peripheral device, said peripheral device comprising a second interface module, said second interface module configured to connect the peripheral device to the communications bus;
    wherein said first and second interface modules each comprises a transceiver interface and a protection circuit, said protection circuit being substantially positioned between said transceiver interface and a port of said communications bus, and configured to automatically provide a protection voltage to the transceiver interface if a power supply for the transceiver interface is inactive, said protection voltage being derived from a data signal received at said port.

11. The system of claim 10, wherein each interface module comprises a plurality of said transceiver interface and said protection circuit, each transceiver interface and each protection circuit being associated with one of said data lines.

12. The system of claim 10, wherein said data signal is a digital signal and said protection voltage is in synchronism with said digital signal.

13. An interface module for a communications system comprising a processing device and a peripheral device which are interconnected through a communications bus having a plurality of data lines, said interface module comprising:
    a transceiver interface; and
    means for deriving a protection voltage from a data signal received from said bus, said means substantially positioned between said transceiver interface and a port configured to receive said data signal, and configured to automatically provide said protection voltage to the transceiver interface if a power supply for the transceiver interface is inactive.

14. A method of protecting a transceiver interface associated with a communications bus to which a processing device and a peripheral device are connected, each one of said devices comprising a transceiver interface, said method comprising:

positioning a protection circuit between said bus and said transceiver interface, said protection circuit having a first input for a supply voltage, a second input connected to said bus, and an output connected to the transceiver interface;

generating within said protection circuit a control signal if said supply voltage is deactivated;

using said control signal to couple said second input to said output in order to derive a protection voltage from a data signal received from said bus; and feeding said protection voltage to the transceiver interface via said output.

* * * * *